United States Patent [19]

Hagino

[11] Patent Number: 5,561,394

[45] Date of Patent: Oct. 1, 1996

[54] ACTIVE BANDPASS FILTER

[75] Inventor: Hideyuki Hagino, Kumagaya, Japan

[73] Assignee: Kabushiki Kaisha Toshiba, Kawasaki, Japan

[21] Appl. No.: 487,535

[22] Filed: Jun. 7, 1995

[30] Foreign Application Priority Data

Aug. 1, 1994 [JP] Japan .................................... 6-180309

[51] Int. Cl.⁶ .................................................. H03K 5/00
[52] U.S. Cl. .......................... 327/557; 327/552; 330/294; 330/107
[58] Field of Search .................................. 330/294, 107, 330/109; 327/552, 553, 554, 555, 556, 557, 558, 559, 563

[56] References Cited

U.S. PATENT DOCUMENTS

| | | | |
|---|---|---|---|
| 3,949,316 | 4/1976 | Tsurushima | 330/107 |
| 3,974,399 | 8/1976 | Oyama et al. | 327/556 |
| 4,524,332 | 6/1985 | Gay | 330/107 |

FOREIGN PATENT DOCUMENTS

| | | |
|---|---|---|
| 0086026 | 8/1983 | European Pat. Off. . |
| 167015 | 3/1989 | Japan . |
| 6283965 | 10/1994 | Japan . |
| 1603530 | 11/1981 | United Kingdom . |

Primary Examiner—Timothy P. Callahan
Assistant Examiner—Dinh T. Le
Attorney, Agent, or Firm—Oblon, Spivak, McClelland, Maier & Neustadt, P.C.

[57] ABSTRACT

An active bandpass filter offers freely settable values of quality factor Q and peak gain. The active bandpass filter has a first, a second and a third transistor. The first transistor has a base connected to an input terminal of the filter via a first resistance element, a collector connected both to a constant voltage source via a second resistance element and to an output terminal of the filter and an emitter connected to a first constant current source. The second transistor has a base connected to the emitter of the first transistor via a third resistance element, a collector connected to the constant voltage source via a fourth resistance element and an emitter connected both to the base of the first transistor via a first capacitance element and to a second constant current source. The third transistor has a base connected to the collector of the second transistor, a collector connected to the constant voltage source and an emitter connected both to the base of the second transistor via a second capacitance element and to a third constant current source. Resistors can be used instead of the constant current sources.

7 Claims, 2 Drawing Sheets

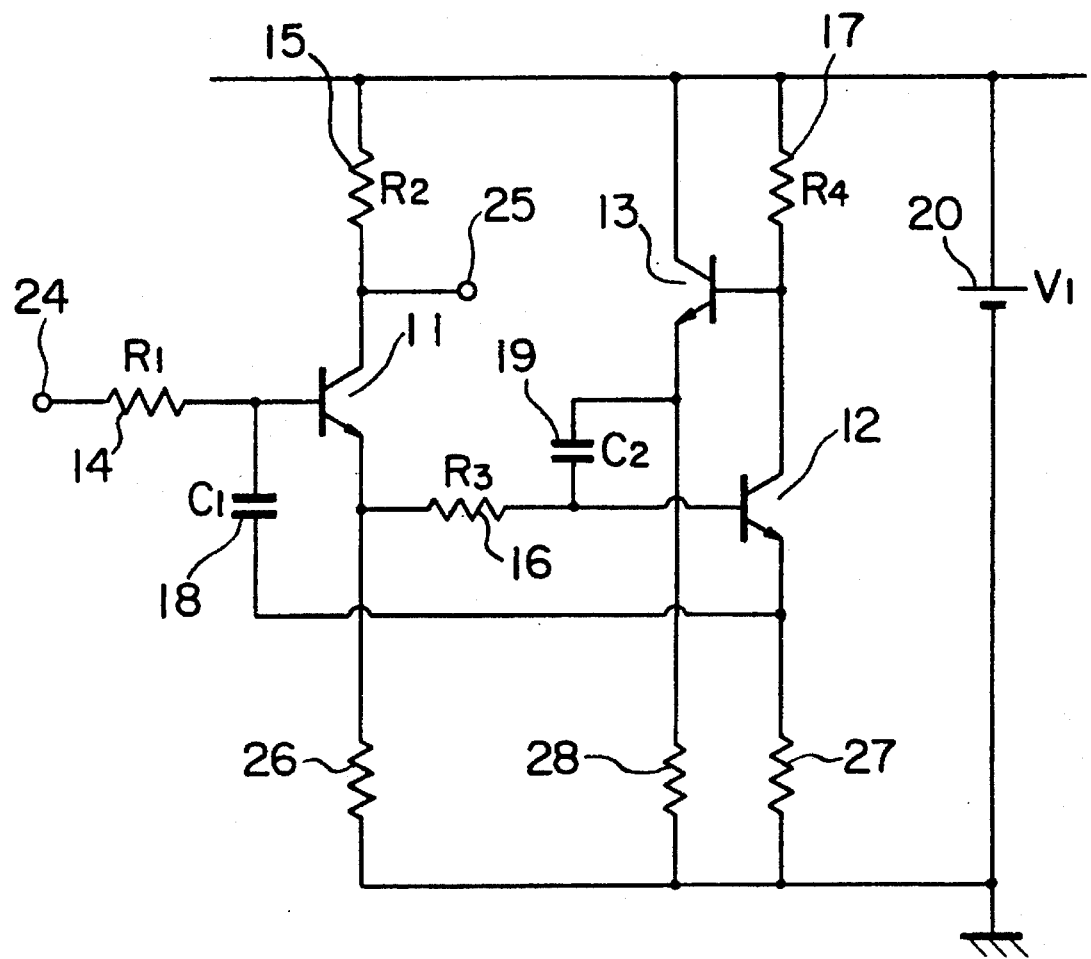
F I G. 3

ACTIVE BANDPASS FILTER

BACKGROUND OF THE INVENTION

The present invention relates to a bandpass filter which uses active elements, that is, to an active bandpass filter, and more particularly to an active bandpass filter with improved degree of freedom in setting quality factor Q and peak gain.

FIG. 1 is a schematic circuit diagram an example of the configuration of a conventional bandpass filter. In this drawing, an input terminal 31 which accepts an input signal $v_i$ is connected to one end of a capacitor 32, which has a capacitance value of $C_{31}$. The other end of the capacitor 32 is connected to one end of a resistor 33 which has a resistance value of $R_{31}$, and also to one end of a resistor 34 which has a resistance value of $R_{32}$. The other end of the resistor 33 is grounded. The other end of the resistor 34 is grounded through a capacitor 35 which has a capacitance value of $C_{32}$, and is also connected to an output terminal 36 used to output an output signal $v_o$.

In a filter circuit such as described above, the transfer function G(b/a) is given by equation (1).

$$G\left(\frac{b}{a}\right) = \frac{\frac{1}{C_{32}R_{32}} s}{s^2 + \frac{C_{31}R_{31} + C_{32}R_{31} + C_{32}R_{32}}{C_{31}C_{32}R_{31}R_{32}} s + \frac{1}{C_{31}C_{32}R_{31}R_{32}}} \quad (1)$$

$(s = j\omega, j = (-1)^{1/2}, \omega$: frequency)

The cutoff frequency $\omega_0$ is expressed by equation (2).

$$\omega_0 = \frac{1}{\sqrt{C_{31}C_{32}R_{31}R_{32}}} \quad (2)$$

The quality factor Q and the peak gain H are expressed by equation (3) and equation (4), respectively.

$$Q = \frac{\sqrt{C_{31}C_{32}R_{31}R_{32}}}{C_{31}R_{31} + C_{32}R_{31} + C_{32}R_{32}} \quad (3)$$

$$H = \frac{C_{31}R_{31}}{C_{31}R_{31} + C_{32}R_{31} + C_{32}R_{32}} \quad (4)$$

However, in a conventional bandpass filter, such as shown in FIG. 1, there is a shortcoming in that the quality factor Q cannot be set to a value of 0.5 or higher. Another shortcoming is that it is not possible to have a peak gain H of 1 or higher.

If the substitutions $C_{31}nC_{32}$ and $R_{31}=mR_{32}$ (n, m>0) are made in equation (2), the cutoff frequency $\omega_0$ is expressed as in equation (5), so that the quality factor Q is expressed as in equation (6).

$$\omega_0 = \frac{1}{C_{32}R_{32}} \frac{1}{\sqrt{nm}} = const \quad (5)$$

$$Q = \frac{\sqrt{nm}}{1 + m + nm} \quad (6)$$

If we hold n constant and consider the maximum value of Q, it is seen by equation (7) that the value of Q is maximum when $m=1/(n+1)$.

$$\frac{\partial Q}{\partial m} = \frac{(nm+m+1)\left(\frac{1}{2}\sqrt{\frac{n}{m}}\right) - \sqrt{nm}(n+1)}{(nm+m+1)^2} \quad (7)$$

$$= \frac{\frac{1}{2}\sqrt{\frac{n}{m}}\{1-m(n+1)\}}{(nm+m+1)^2}$$

If we let $Q_{max}$ be this maximum value of Q, this value is expressed as follows.

$$Q_{max} = \frac{1}{2}\sqrt{\frac{n}{n+1}} < \frac{1}{2} \quad (8)$$

Therefore, the value of Q cannot be 0.5 or higher.

Equation (4) can be rewritten in the form of equation (9). Since $C_{31}$, $C_{32}$, $R_{31}$, and $R_{32}$ are all larger than zero, it is impossible for the peak gain H to be 1 or higher.

$$H = 1 - \frac{C_{32}R_{31} + C_{32}R_{32}}{C_{31}R_{31} + C_{32}R_{31} + C_{32}R_{32}} \quad (9)$$

To achieve superior filter characteristics, it is desirable to have a waveform as the output signal $v_o$ that changes sharply with respect to frequency, that is, it is desirable that the value of Q be made large. Enabling the setting of the peak gain H to a value of 1 or higher is also advantageous from the standpoint of circuit design.

Japanese laid-open patent No. 1989-067015 discloses a filter in that the values of quality factor Q and peak gain can be made larger than those of the conventional filter described above. This filter, however, includes complicated transformer-conductance amplifiers (variable voltage-current converters). Further, Japanese laid-open patent No. 1994-283965 discloses an active filter without variable voltage-current converters. This filter, however, is not an active bandpass filter but an active lowpass filter.

SUMMARY OF THE INVENTION

The present invention has as an object the provision of an active bandpass filter of simple circuit configuration which offers free setting of the value of quality factor Q and peak gain.

The present invention provides an active bandpass filter having an input terminal and an output terminal, comprising: a first transistor having an emitter, a base connected to an input terminal via a first resistance element, a collector connected both to a constant voltage source via a second resistance element and to the output terminal; first means for supplying a first constant current to the emitter of the first transistor; a second transistor having a base connected to the emitter of the first transistor via a third resistance element, a collector connected to the constant voltage source via a fourth resistance element and an emitter connected to the base of the first transistor via a first capacitance element; second means for supplying a second constant current to the emitter of the second transistor; a third transistor having a base connected to the collector of the second transistor, a collector connected to the constant voltage source and an emitter connected to the base of the second transistor via a second capacitance element; and third means for supplying a third constant current to the emitter of the third transistor.

The first, second and third means may include a constant current source or a resistance element.

BRIEF DESCRIPTION OF THE DRAWINGS

FIG. 3 is a schematic circuit diagram which shows the configuration of another preferred embodiment of an active bandpass filter according to the present invention.

DESCRIPTION OF THE PREFERRED EMBODIMENTS

An embodiment of the present invention will now be described, with reference made to the accompanying drawings.

Figure 1:
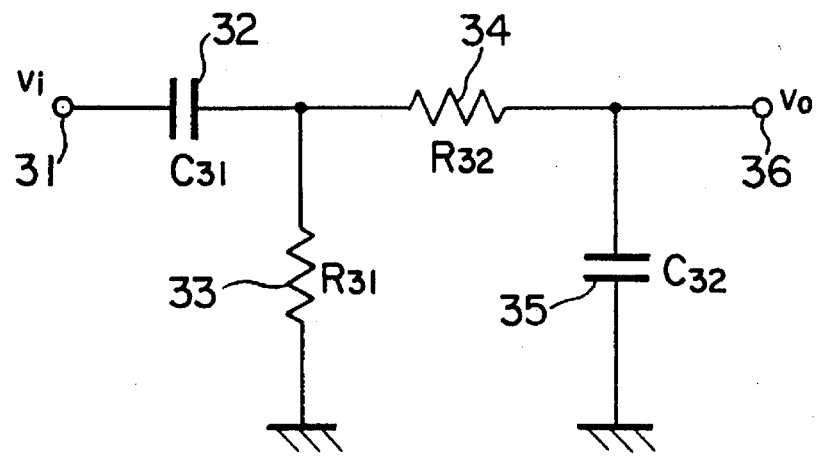
FIG. 1 is a schematic circuit diagram which shows an example of the configuration of a conventional bandpass filter.
Figure 2:
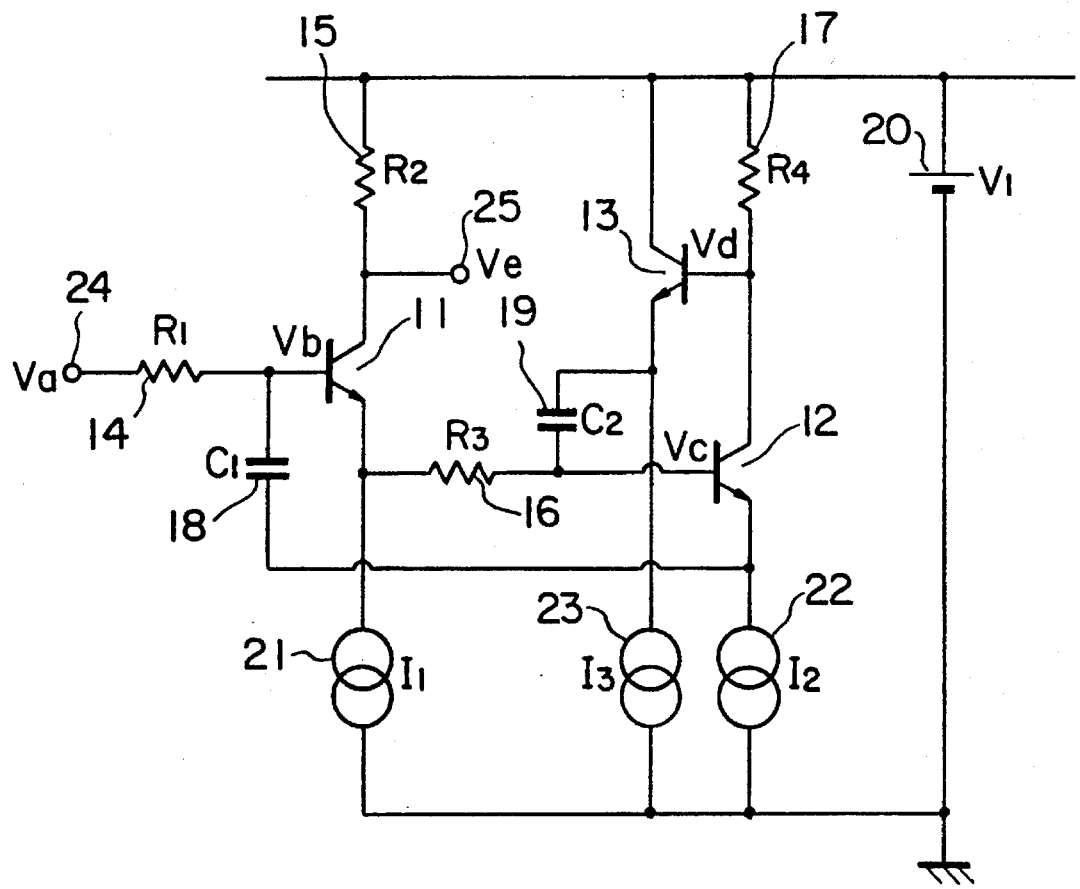
FIG. 2 is a schematic circuit diagram which shows the configuration of a preferred embodiment of an active bandpass filter according to the present invention.

FIG. 2 is a circuit diagram which shows the configuration of a preferred embodiment of an active bandpass filter according to the present invention.

As is shown in FIG. 2, the base of a first bipolar transistor 11 is connected to an input terminal 24 via a first resistor 14 having a resistance value of $R_1$. The collector of the transistor 11 is connected to a voltage regulator 20 for supplying a constant voltage $V_1$ to the filter via a second resistor 15 having a resistance value of $R_2$ and is also connected to an output terminal 25. In addition, the emitter of the transistor 11 is connected to a first constant current source 21 for supplying a first constant current $I_1$ to the transistor 11.

The base of a second bipolar transistor 12 is connected to the emitter of the transistor 11 via a third resistor 16 having a resistance value of $R_3$. The collector of transistor 12 is connected to the voltage regulator 20 via a fourth resistor 17 having a resistance value of $R_4$. The emitter of the transistor 12 is connected to the base of the transistor 11 via a first capacitor 18 having a capacitance value of $C_1$ and is also connected to a second constant current source 22 for supplying a second constant current $I_2$ to the transistor 12.

The base of a third bipolar transistor 13 is connected to the collector of the transistor 12. The collector of the transistor 13 is connected to the voltage regulator 20. In addition, the emitter of the transistor 13 is connected to the base of the transistor 12 via a second capacitor 19 having a capacitance value of $C_2$, and is also connected to a third constant current source 23 for supplying a third constant current $I_3$ to, the transistor 13.

In the active bandpass filter of FIG. 2, an input signal voltage $V_a$ at thee input terminal 24, a base voltage $V_b$ of the transistor 11, a base voltage $V_c$ of the transistor 12, a base voltage $V_d$ of the transistor 13, and an output signal voltage $V_e$ at the output terminal 25 are expressed by equations (10) through (13).

$$V_b = \frac{1}{1+sC_1R_1} V_a + \frac{sC_1R_1}{1+sC_1R_1} V_c \quad (10)$$

$$V_c = \frac{1}{1+sC_2R_3} V_b + \frac{sC_2R_3}{1+sC_2R_3} V_d \quad (11)$$

$$V_d = (V_a - V_c) \frac{sC_1R_4}{1+sC_1R_1} \quad (12)$$

$$V_e = (V_c - V_b) \frac{R_2}{R_3} \quad (13)$$

Additionally, by virtue of equations (10) through (13), the overall transfer function G(e/a) of the active bandpass filter is given by equation (14).

$$G\left(\frac{e}{a}\right) = \frac{-\frac{1}{C_1(R_1+R_4)} \cdot \frac{R_2}{R_3} s}{s^2 + \frac{1}{C_1(R_1+R_4)} s + \frac{1}{C_1 C_2 R_2 (R_1+R_4)}} \quad (14)$$

The cutoff frequency $\omega_0$ is expressed by equation (15).

$$\omega_0 = \frac{1}{\sqrt{C_1 C_2 R_3 (R_1+R_4)}} \quad (15)$$

The quality factor Q and peak gain H are given by equation (16) and equation (17), respectively.

$$Q = \sqrt{\frac{C_1(R_1+R_4)}{C_3 R_3}} \quad (16)$$

$$H = \frac{R_2}{R_3} \quad (17)$$

If $C_1=nC_2$, $R_1+R_4=mR_3$ (where n, m>0) are substituted into the above-noted equation (15), the cutoff frequency $\omega_0$ is expressed by equation (18), so that the quality factor Q is expressed by equation (19).

$$\omega_0 = \frac{1}{C_2 R_3} \cdot \frac{1}{\sqrt{nm}} = const \quad (18)$$

$$Q = \sqrt{nm} \quad (19)$$

From equation (19), it can be seen that by appropriately selecting the values of n and m (that is, by appropriately selecting the capacitance values $C_1$ and $C_2$ of the capacitors 18 and 19 and the resistance values $R_1$, $R_2$, and $R_4$ of the resistance elements 14, 15, and 17, respectively), it is possible to set the quality factor Q freely, without limitation. That is, in accordance with this embodiment of the present invention, the limitation to a value of Q below 0.5, which is imposed in the conventional bandpass filter, is not imposed.

Furthermore, from the above-noted equation (17), by appropriately selecting the respective resistance values $R_2$ and $R_3$ of the resistance elements 15 and 16, it is possible to set the peak gain H freely, without limitation, so that the limitation to a value of peak gain less than 1, which is imposed in the conventional bandpass filter, is not imposed.

FIG. 3 is a schematic circuit diagram which shows another preferred embodiment of an active bandpass filter according to the present invention. In this figure, elements which are the same as shown in FIG. 2 are assigned the same reference numerals.

In the active bandpass filter shown in FIG. 3, the configuration differs from the configuration shown in FIG. 2 in that resistors 26, 27, and 28 are used instead of the first through third constant current sources 21, 22 and 23. Combination of resistors and constant current sources is also available, such as, the current sources 21 and 22 and the resistor 28.

The cutoff frequency $\omega_0$, quality factor Q, and peak gain H given by equations (15) through (19) can be achieved even in the case in which resistors are used instead of constant current sources, enabling achievement of the desired effect of the present invention.

As described in detail above, in accordance with the present invention, an active bandpass filter offering free setting of the values of quality factor Q and peak gain is provided.

What is claimed is:

1. An active bandpass filter having an input terminal and an output terminal, comprising:

a first transistor having an emitter, a base connected to the input terminal via a first resistance element, a collector connected both to a constant voltage source via a second resistance element and to the output terminal;

first means for supplying a first constant current to the emitter of the first transistor;

a second transistor having a base connected to the emitter of the first transistor via a third resistance element, a collector connected to the constant voltage source via a fourth resistance element, and an emitter connected to the base of the first transistor via a first capacitance element;

second means for supplying a second constant current to the emitter of the second transistor;

a third transistor having a base connected to the collector of the second transistor, a collector connected to the constant voltage source, and an emitter connected to the base of the second transistor via a second capacitance element; and third means for supplying a third constant current to the emitter of the third transistor.

2. An active bandpass filter according to claim 1, wherein the first means includes a constant current source.

3. An active bandpass filter according to claim 1, wherein the first means includes a resistance element.

4. An active bandpass filter according to claim 1, wherein the second means includes a constant current source.

5. An active bandpass filter according to claim 1, wherein the second means includes a resistance element.

6. An active bandpass filter according to claim 1, wherein the third means includes a constant current source.

7. An active bandpass filter according to claim 1, wherein the third means includes a resistance element.

* * * * *